(12) United States Patent
Jiang et al.

(10) Patent No.: US 10,685,971 B2
(45) Date of Patent: Jun. 16, 2020

(54) THREE DIMENSIONAL MEMORY DEVICE AND METHOD FOR FABRICATING THE SAME

(71) Applicant: MACRONIX INTERNATIONAL CO., LTD., Hsinchu (TW)

(72) Inventors: Yu-Wei Jiang, Hsinchu (TW); Chieh-Fang Chen, Zhubei (CN); Jia-Rong Chiou, Zhubei (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/159,753

(22) Filed: Oct. 15, 2018

(65) Prior Publication Data

US 2020/0119025 A1 Apr. 16, 2020

(51) Int. Cl.

| | |
|---|---|
| H01L 21/76 | (2006.01) |
| H01L 21/822 | (2006.01) |
| H01L 21/8234 | (2006.01) |
| H01L 27/11521 | (2017.01) |
| H01L 27/11556 | (2017.01) |
| H01L 27/11568 | (2017.01) |

(Continued)

(52) U.S. Cl.
CPC ........ *H01L 27/11521* (2013.01); *G11C 5/025* (2013.01); *G11C 5/06* (2013.01); *G11C 5/12* (2013.01); *G11C 16/0483* (2013.01); *H01L 21/76* (2013.01); *H01L 21/8221* (2013.01); *H01L 21/8234* (2013.01); *H01L 27/11556* (2013.01); *H01L 27/11568* (2013.01); *H01L 27/11582* (2013.01)

(58) Field of Classification Search
CPC ......... H01L 27/11521; H01L 27/11556; H01L 27/11568; H01L 27/11582; H01L 21/76; H01L 21/8221; H01L 21/8234; G11C 5/025; G11C 5/06; G11C 5/12; G11C 16/0483
USPC ....................................................... 257/314
See application file for complete search history.

(56) References Cited

U.S. PATENT DOCUMENTS 9,401,371 B1 7/2016 Lee et al.
10,453,856 B1 * 10/2019 Lai ...................... H01L 29/7926
(Continued)

OTHER PUBLICATIONS

TIPO Office Action dated Mar. 11, 2018 in Taiwan application (No. 107136242).

*Primary Examiner* — Tong-Ho Kim
(74) *Attorney, Agent, or Firm* — McClure, Qualey & Rodack, LLP

(57) ABSTRACT

A 3D memory device includes a substrate, a plurality of conductive layers, a plurality of insulating layers, a memory layer and a channel layer. The insulating layers are alternately stacked with the conductive layers on the substrate to form a multi-layers stacking structure, wherein the multi-layers stacking structure has at least one trench penetrating through the insulating layers and the conductive layers. The memory layer covers on the multi-layers stacking structure and at least extends onto a sidewall of the trench. The cannel layer covers on the memory layer and includes an upper portion adjacent to an opening of the trench, a lower portion adjacent to a bottom of the trench and a string portion disposed on the sidewall, wherein the string portion connects the upper portion with the lower portion and has a doping concentration substantially lower than that of the upper portion and lower portion.

11 Claims, 13 Drawing Sheets

(51) Int. Cl.
*H01L 27/11582* (2017.01)
*G11C 5/02* (2006.01)
*G11C 5/06* (2006.01)
*G11C 5/12* (2006.01)
*G11C 16/04* (2006.01)

(56) References Cited

U.S. PATENT DOCUMENTS

2007/0158736 A1* 7/2007 Arai .................... H01L 27/105
                                                   257/315
2013/0341702 A1   12/2013 Kar et al.
2015/0076586 A1*  3/2015 Rabkin .............. G11C 16/0483
                                                   257/324

* cited by examiner

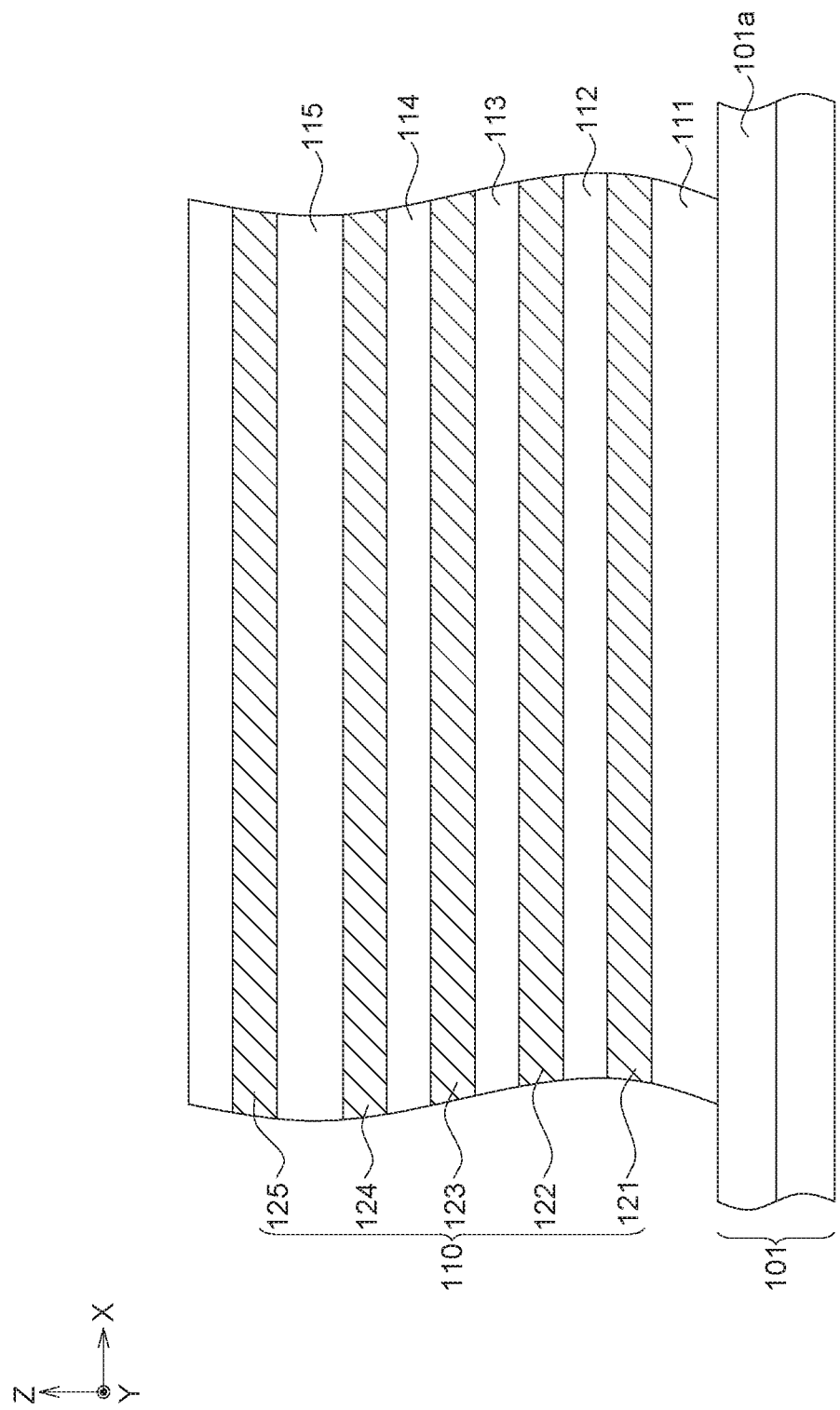

THREE DIMENSIONAL MEMORY DEVICE AND METHOD FOR FABRICATING THE SAME

BACKGROUND

Technical Field

The disclosure in generally relates to a non-volatile memory (NVM) device and method for fabricating the same, and more particularly to a three dimensional (3D) NVM memory device a method for fabricating the same.

Description of the Related Art

Non-volatile memory (NVM) devices which are able to continually store information even when the supply of electricity is removed from the device containing the NVM cells has been widespread adopted by bulk solid state memory applications in portable audiovisual entertainment devices, cell phones or digital cameras etc. Recently, various 3D memory devices, such as a vertical-channel 3D NVM flash memory device that has a multi-layer stack structure may possess a higher density memory and excellent electrical characteristics, e.g. reliability in data storage and high operating speed, has been provided in order to accommodate the rising demand for superior memory.

A typical vertical-channel 3D NVM flash memory device includes a multi-layers stacking structure constituted by a plurality of insulation layers and a plurality of conductive layers alternatively stacked with each other. The multi-layers stacking structure includes at least one trench used to divide the multi-layers stacking structure into a plurality of ridge-shaped stacks each of which comprises a plurality of conductive stripes formed by the patterned conductive layers. The 3D NNM flash memory device further comprises a memory layer 103 and channel layer, wherein the memory layer is disposed on sidewalls of the trench; the channel layer covers on the ridge-shaped stacks 102 and the channel layer; and a plurality of memory cells are defined at the positions where the conductive stripes, the memory layer and the channel layer intersected with each other. The memory cells that are electrically connected in series to form a vertical string electrical connection by the channel layer are electrically connected to a corresponding bit line (not shown) through a metal contact formed on the channel layer overlaid on the ridge-shaped stacks.

However, as the levels of the multi-layers stacking structure increases, the operation current may be increased resulted from the incensement of memory cells included in one single vertical string; and the channel resistance of the memory cells formed on the lower portion of the trenches due to the dimension shrinkage in the bottom of the trenches triggered by the natures of the etching process, so as to deteriorate the performance and reliability of the 3D NNM flash memory device.

Therefore, there is a need of providing an improved 3D memory device and the method for fabricating the same to obviate the drawbacks encountered from the prior art.

SUMMARY

One aspect of the present disclosure is to provide a 3D memory device, wherein the 3D memory device includes a substrate, a plurality of conductive layers, a plurality of insulating layers, a memory layer and a channel layer. The insulating layers are alternately stacked with the conductive layers on the substrate to form a multi-layers stacking structure, wherein the multi-layers stacking structure has at least one trench penetrating through the insulating layers and the conductive layers. The memory layer covers on the multi-layers stacking structure and at least extends onto a sidewall of the trench. The cannel layer covers on the memory layer and includes an upper portion adjacent to an opening of the trench, a lower portion adjacent to a bottom of the trench and a string portion disposed on the sidewall, wherein the string portion connects the upper portion with the lower portion and has a doping concentration substantially lower than that of the upper portion and lower portion.

Another aspect of the present disclosure is to provide a method for fabricating a 3D memory device, wherein the method includes steps as follows: A multi-layers stacking structure including a plurality of conductive layers and a plurality of insulating layers alternately stacked on a substrate is firstly provided. Next, the multi-layers stacking structure is patterned to form at least one trench penetrating through the insulating layers and the conductive layers. A memory layer is then formed to cover on the multi-layers stacking structure and at least extend onto a sidewall of the trench. Subsequently, a channel layer is formed to cover on the memory layer. Prior to full-filling of the trench with a dielectric material, an ion implantation process is performed to drive a plurality of dopants into the channel layer, so as to at least divide the channel layer into an upper portion adjacent to an opening of the trench, a lower portion adjacent to a bottom of the trench and a string portion disposed on the sidewall, wherein the string portion connects the upper portion with the lower portion and has a doping concentration substantially lower than that of the upper portion and lower portion.

In accordance with the aforementioned embodiments of the present disclosure, a 3D memory device and the method for fabricating the same are provided. A patterned multi-layers stacking structure having a least one trench is firstly provided on a substrate. A memory layer and a channel are formed in sequence to cover on the patterned multi-layers stacking structure and at least extend into a sidewall of the trench. Prior to full-filling of the trench with a dielectric material, an ion implantation process is performed to drive a plurality of dopants into the channel layer, so as to make a string portion that is disposed on the sidewall of the trench has a doping concentration substantially lower than that of an upper portion of the channel adjacent to the opening of the trench and a lower portion of the channel adjacent to the bottom of the trench.

Because the upper portion and the lower portion of the channel layer can contain charged ion resulted from the ion implantation process, the resistance of the channel layer can be reduced significantly, and the problems of high channel resistance due to the increase in the levels of the multi-layers stacking structure and due to the natures of the etching process for forming the trenches in the multi-layers stacking structure to result in the dimension shrinkage of the trench bottom portion may be obviated.

BRIEF DESCRIPTION OF THE DRAWINGS

The above objects and advantages of the present disclosure will become more readily apparent to those ordinarily skilled in the art after reviewing the following detailed description and accompanying drawings, in which:

FIGS. 1A to 1F are cross-sectional views illustrating a series processing structures for forming a 3D memory device in accordance with one embodiment of the present disclosure.

DETAILED DESCRIPTION

Figure 1B:
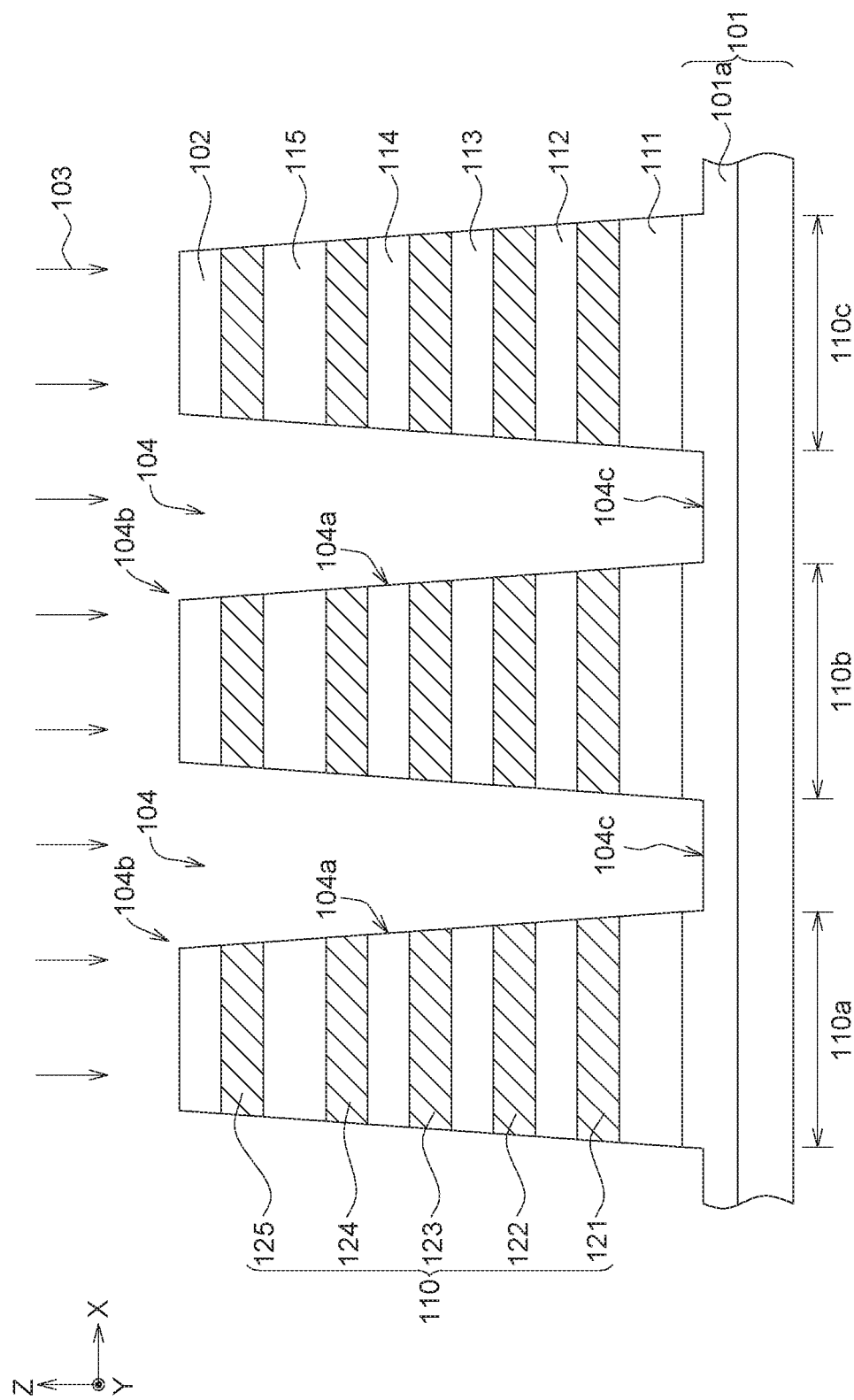
Figure 1C:
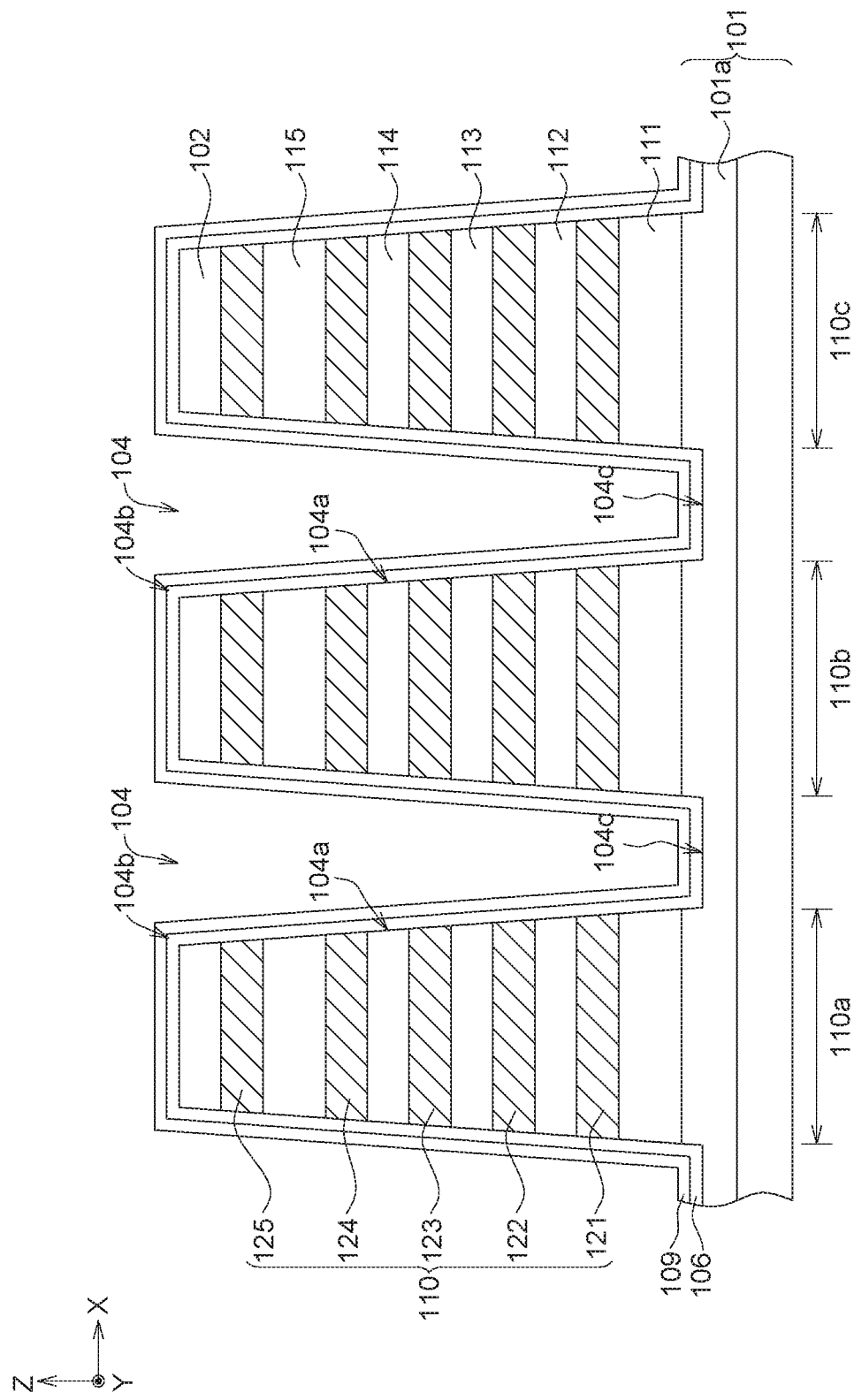

The embodiments as illustrated below provide a 3D memory device and the method for fabricating the same to solve the problems of high channel resistance due to the increase in the levels of the multi-layers stacking structure and due to the natures of the etching process for forming the trenches in the multi-layers stacking structure to result in the dimension shrinkage of the trench bottom portion. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

FIGS. 1A to 1F are cross-sectional views illustrating a series processing structures for forming a 3D memory device 100 in accordance with one embodiment of the present disclosure. The method for fabricating a 3D memory device 100 comprises several steps as follows: Firstly, a substrate 101 is provided, and a multi-layer stacking structure 110 is formed on the substrate 101 (see FIG. 1A). In some embodiments of the present disclosure, the substrate 101 may include a dielectric isolation layer 101a, and the multi-layer stacking structure 110 is formed on and directly in contact to the dielectric isolation layer 101a.

The multi-layer stacking structure 110 comprises a plurality of conductive layers 111-115, and a plurality of insulating layers 121-125. In the present embodiment, the insulating layers 121-125 are alternately stacked with the conductive layer 111-115 on the substrate 101 along the Z-axis as illustrated in FIG. 1A, As a result, the conductive layer 111 is disposed at the bottom of the multi-layer stack 110, and the insulating layer 125 is disposed at the top most of the multi-layer stack 110.

The conductive layers 111-115 can be formed of metal, such as copper (Cu), aluminum (Al), metal ally, metal oxide or other suitable metallic materials. Alternatively, the conductive layers 111-115 can be formed of an undoped semiconductor material, such as epitaxial single crystal silicon or poly-silicon (Si)/germanium (Ge). Still alternatively, the conductive layers 111-115 can be formed of doped semiconductor material, such as n-type poly-silicon/germanium doped with phosphorus (P) or arsenic (As) or p-type poly-silicon doped with boron (B). In the present embodiment, the conductive layers 111-115 are preferably formed of un-doped poly-silicon. The insulating layers 121-125 can be formed of a dielectric material such as silicon oxide, silicon nitride, silicon oxynitride, silicate, or others.

In some embodiments of the present disclosure, the conductive layers 111-115 and the insulating layers 121-125 can be formed by a deposition process, for example, a low pressure chemical vapor deposition (LPCVD) process. The thickness of each one of the insulating layers 121-125 can be about 30 angstrom (Å) to 800 Å The top most conductive layer 115 and the bottom conductive layer 111 may have a thickness substantially greater than that of the other conductive layer 112-114. In the present embodiment, the top most conductive layer 115 and the bottom conductive layer 111 have a thickness about 50 Å to 3000 Å; and the conductive layer 112-114 have a thickness about 30 Å to 800 Å. However, in other embodiments the thicknesses of the conductive layers 111-115 are not limited to these regards.

Next, the multi-layer stack 110 is patterned to form a plurality of ridge-shaped stacks 110a, 110b and 110c (see FIG. 1B). In some embodiments of the present disclosure, the process for patterning the multi-layer stacking structure 110 comprises steps as follows: A hard mask layer 102 is firstly provided on a top surface of the multi-layer stacking structure 110. Next, the hard mask layer 102 is patterned, and an anisotropic etching process, such as reactive ion etching (RIE) process is performed using the patterned hard mask 102 as an etching mask to remove a portion of the multi-layer stacking structure 110, so as to form a plurality of trenches 104 extending along the Z-axis, wherein the multi-layer stacking structure 110 may be divided into the plurality of ridge-shaped stacks 110a, 110b and 110c extending along the Y-axis (perpendicular to the X-axis); and portions of the dielectric isolation layer 101a can be exposed from the trenches 104. In the present embodiment, the patterned hard mask layer 102 is a silicon nitride layer formed on the top surface of the insulating layer 125.

Thereinafter, a memory layer 106 is formed on the multi-layers stacking structure 110 to cover on the top surface of the ridge-shaped stacks 110a, 110b and 110c and to extend into the trenches 104, so as to cover on the sidewalls 104a of and the bottoms of the trenches 104 (that are the portions of the dielectric isolation layer 101a exposed from the trenches 104). Subsequently, a channel layer 109 is formed to blanket over the memory layer 106 by a conformal deposition process (see FIG. 1C).

In some embodiments of the present disclosure, the memory layer 106 may be formed of a composite layer including a silicon oxide layer, a silicon nitride layer, and a silicon oxide layer (i.e., an ONO structure). However, the structure of the memory layer 106 is not limited to this regard. In some other embodiments, the composite layer of the material of memory layer 106 may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the memory layer 106 can be an ONO composite layer formed by a LPCVD process and has a thickness about 60 Å to 600 Å.

The material used to constitute the channel layer 109 may include a semiconductor material, such as n+-type poly-silicon (n-type epitaxial single crystal silicon) doped with phosphorus or arsenic, p+-type poly-silicon (p-type epitaxial single crystal silicon) doped with boron or un-doped poly-silicon, a silicide, such as, an oxide semiconductor material, such indium zinc oxide. Alternatively, the conductive layer 150 may be formed of silicide, such as titanium/silicon (TiSi), cobalt/silicon (CoSi) or germanium/silicon. (SiGe), oxide semiconductor, such as (InZnO) or indium-gallium-zinc oxide (InGaZnO), or a combination of two or more of these materials. In the present embodiment, the channel layer 109 includes an un-doped poly-silicon and has a thickness about 30 Å to 500 Å.

Figure 1D:
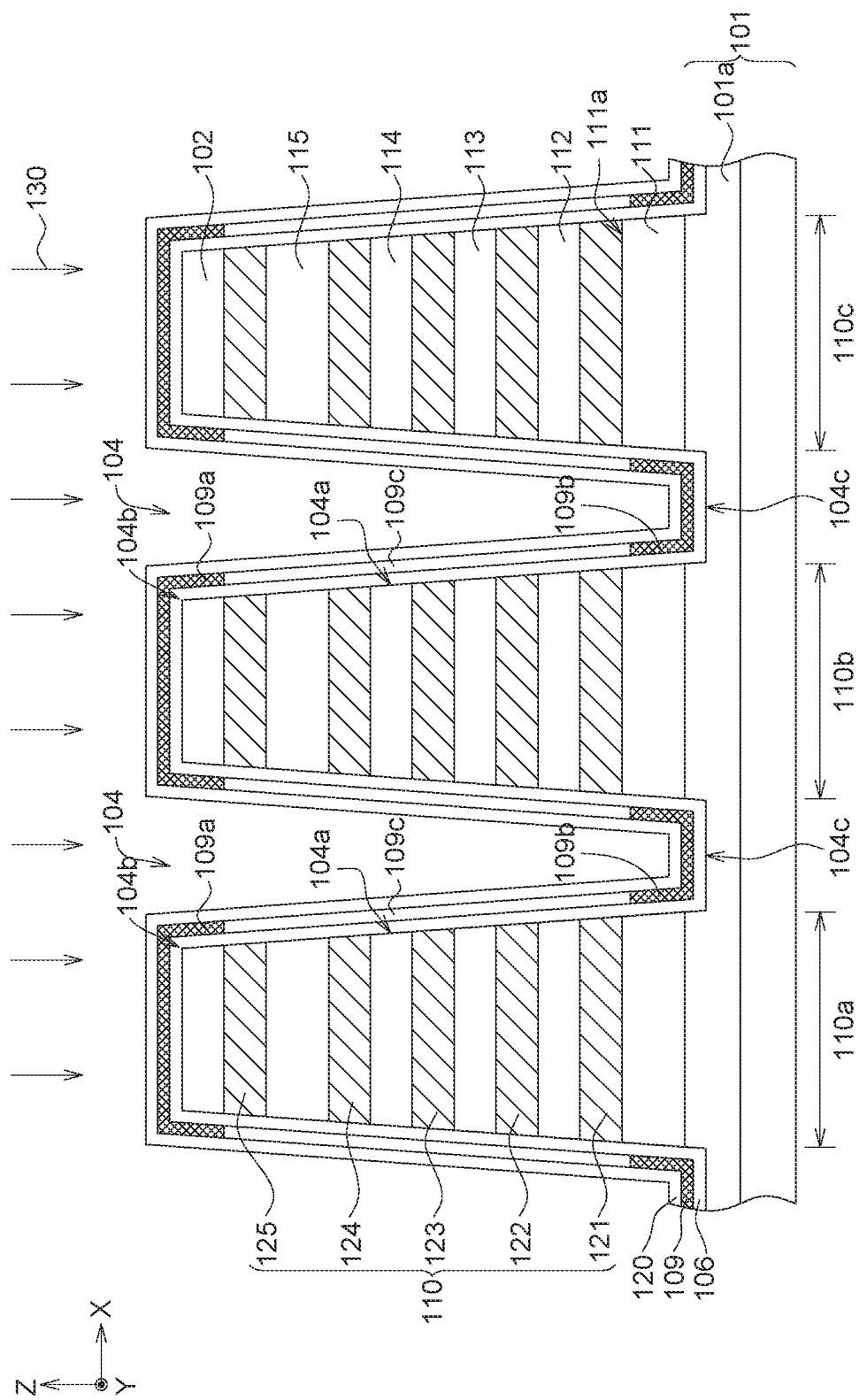

The channel layer 109 is then subjected to an ion implantation process 130 by which a plurality of dopants are driven into the channel layer 109, so as to at least divide the channel layer 109 into an upper portion 109a, a lower portion 109b and a string portion 109c (see FIG. 1D). Since each of the trenches 104 has a profile narrowed from top to bottom due to the natures of the etching process for forming the same, thus most of the dopants provided by the ion implantation process 130 may be likely driven into the upper portion 109a adjacent to an opening 104b of the trench 104 and the lower portion 109b adjacent to the bottom 104c of the trench 104, and the dopants may be seldom being driven into the string portion 109c that is disposed on the sidewall and used to connect the upper portion 109a and the lower portion 109b. As a result, the string portion 109c of the channel layer 109 may have a doping concentration substantially lower than that of the upper portion 109a and a lower portion 109b of the channel layer 109. In some embodiments of the present disclosure, the lower portion 109b of the channel layer 109 may extend upwards from the bottom 104c of the trenches 104 but not beyond the top surface 111a of the low most conductive layer 111 of the multi-layers structure 110.

In some embodiments of the present disclosure, prior to the ion implantation process 130, a protection layer 120 may be optionally formed on the sidewalls 104a and the bottom 104c of the trenches 104 (see FIG. 1D). In the present embodiment, the protection layer 120 can be a silicon dioxide (SiO2) layer formed by a thermal oxidation process or a deposition process, wherein the protection layer 120 covers on the upper portion 109a, the string portion 109c and a lower portion 109b of the channel layer 109 for tuning the penetration depth of the ions and protect the channel layer 109 from being damaged by the ion bombardment resulted from the ion implantation 130.

Figure 1E:
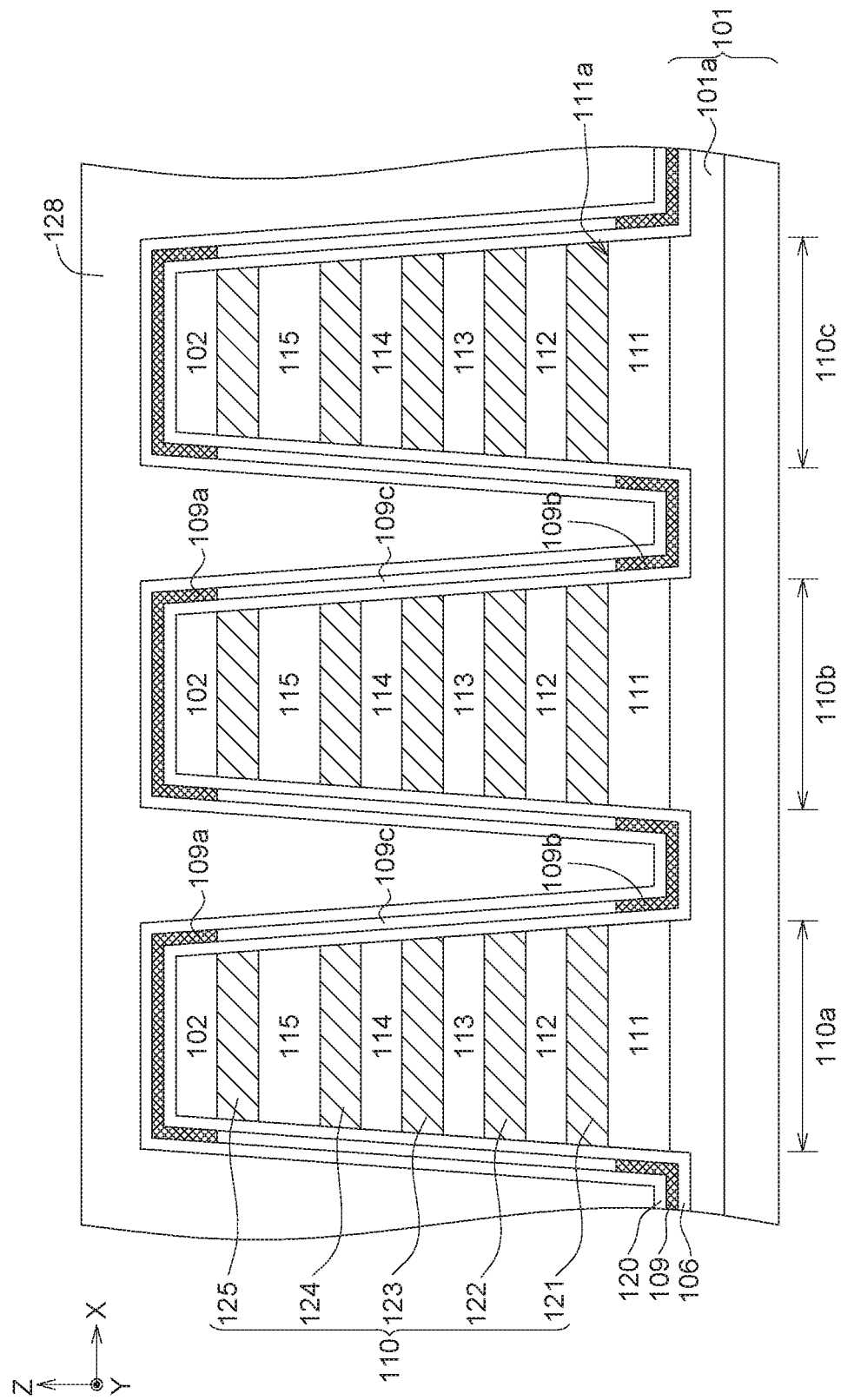

Thereafter, a dielectric layer 128 is formed to full-fill the trenches 104 and cover on the channel layer 109 (see FIG. 1E). In some embodiments of the present disclosure, the forming of the dielectric layer 128 includes steps as follows: A dielectric material is firstly provided to full-fill the trenches 104 and cover on the channel layer 109, and a portion of the dielectric material disposed on the multi-layers stacking structure 110 is then removed by a planarization process, such as a chemical mechanical polishing process.

Next, at least one contact plug is formed on each of the ridge-shaped stacks 110a, 110b and 110c, wherein the at least one contact plug penetrates through the dielectric layer 128 and the protection layer 120 and is electrically connected to the top portions 109a of the channel layer 109 respectively disposed on the corresponding ridge-shaped stacks 110a, 110b and 110c. For example, in the present embodiment, two contact plugs 129A and 129B are formed on the ridge-shaped stack 110a; a contact plug 129C is formed on the ridge-shaped stack 110b; and two contact plugs 129D and 129E are formed on the ridge-shaped stack 110c.

Subsequently, another etching process is performed to partially remove the dielectric layer 128 and the upper portion 109a of the channel layer 109 both disposed on the ridge-shaped stacks 110a and 110c, so as to divide the upper portion 109a of the channel layer 109 disposed on the ridge-shaped stacks 110a into a first pad 109a1 and a second pad 109a2 separated with each other to electrically isolate the contact plugs 129A and 129B, and to divide the upper portion 109a of the channel layer 109 disposed on the ridge-shaped stacks 110c into a forth pad 109a4 and a fifth pad 109a5 separated with each other to electrically isolate the contact plugs 129D and 129E.

In the present embodiment, the contact plugs 129A and 129B disposed on the ridge-shaped stack 110a are respectively electrically connected to the first pad 109a1 and the second pad 109a2. The contact plug 129C disposed on the ridge-shaped stack 110b is electrically connected to the upper portion 109a of the channel layer 109 (also referred to as the third pad 109a3) disposed on ridge-shaped stack 110b. The contact plugs 129D and 129E disposed on the ridge-shaped stack 110c are respectively electrically connected to the forth pad 109a4 and the fifth pad 109a5.

The second pad 109a2 is connected to the third pad 109a3 through the portions of the channel layer 109 (including the string portions 109c and the lower portion 109b) disposed between the ridge-shaped stacks 110a and 110b to form a U-shaped channel by which the memory cells 131 formed on the cross points of the U-shaped channel, the conductive layers 112-114 and the memory layer 106 can be electrically connected in series. Whereby, a U-shaped memory cells string 132 can be farmed between the ridge-shaped stacks 110a and 110b. Similarly, the forth pad 109a4 connected to the third pad 109a3 through the portions of the channel layer 109 (including the string portions 109c and the lower portion 109b) disposed between the ridge-shaped stacks 110c and 110b to form a U-shaped memory cells string 133 between the ridge-shaped stacks 110c and 110b.

In the present embodiment, the transistor 134 formed on the cross point of the U-shaped channel, the conductive layer 115 and the memory layer 106 in the ridge-shaped stack 110a can be electrically connected in series with the memory cells 131 and serve as a string select line (SSL) transistor of the U-shaped memory cells string 132, The transistor 135 formed on the cross point of the U-shaped channel, the conductive layer 115 and the memory layer 106 in the ridge-shaped stack 110b can be electrically connected in series with the memory cells 131 and serve as a ground select line (GSL) transistor of the U-shaped memory cells string 132. The transistors 136 and 137 formed on the cross point of the U-shaped channel, the conductive layer 111 and the memory layer 106 in the ridge-shaped stacks 110a and 110b can be electrically connected in series with the memory cells 131 and serve as the inversion assist gate (IG) transistors of the U-shaped memory cells string 132.

Figure 1F:
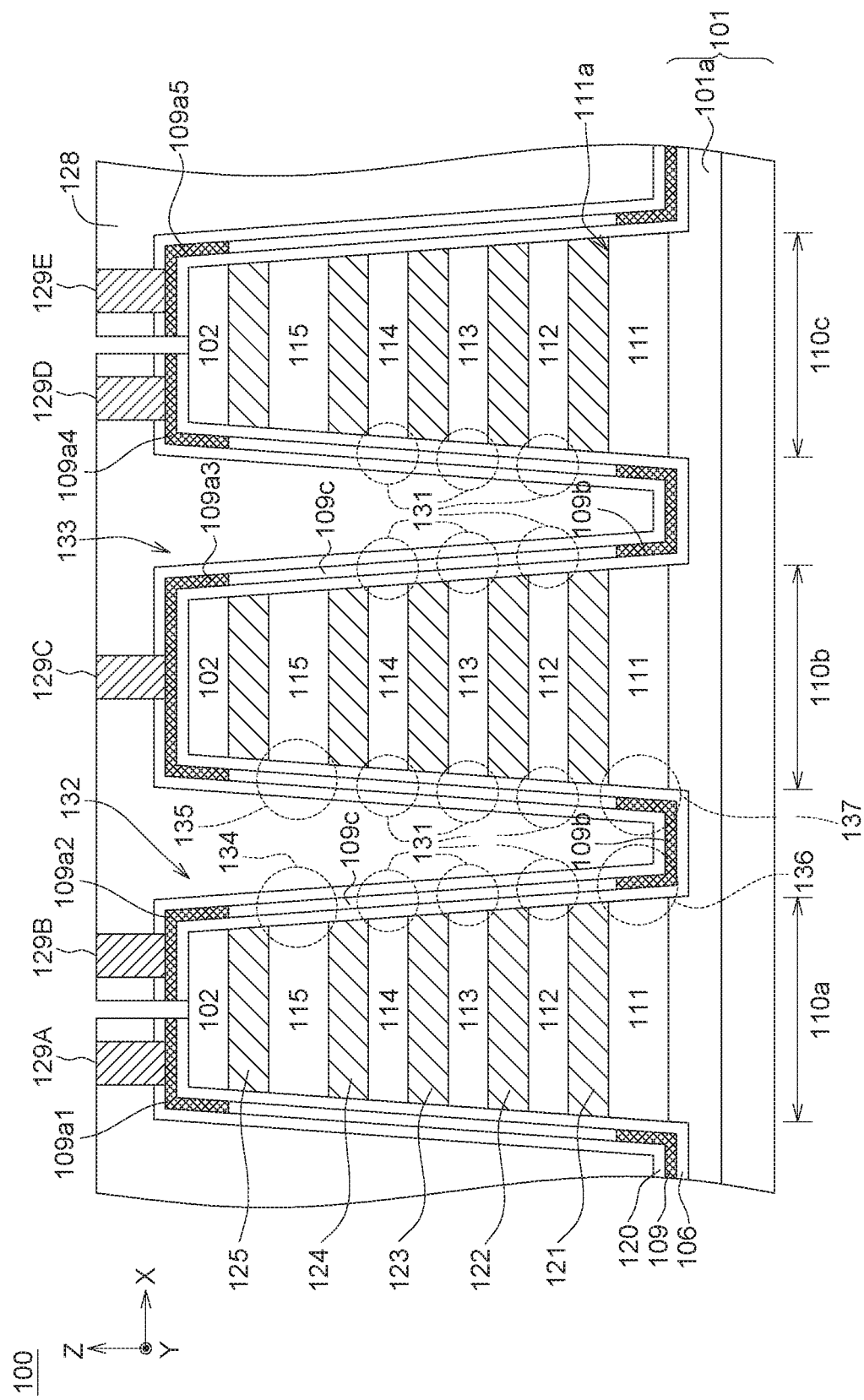

After a series of back end processes are carried out to form a plurality of metal contacts and/or other wires for connecting the contact plugs 129D and 129D with the corresponding bit lines (not shown) and connecting the contact plug 129C with a common source line (not shown), the 3D memory device 100 as shown in FIG. 1F can be obtained.

As discussed above, since each of the trenches 104 has a profile narrowed from top to bottom, thus the channel width of the U-shaped memory cells strings 132 and 133 disposed on the bottom 104c of the trenches 104 may be shrank to make the channel resistance rise sharply. By performing the ion implantation process 130 to drive a plurality of charged dopants into the lower portion 109b of the channel layer 109 disposed on the bottom 104c of the trenches 104 can reduce the channel resistance of the U-shaped memory cells strings 132 and 133. The charged dopants provided by the ion implantation process 130 can be also driven into the upper portion 109a of the channel layer 109 to further decrease the channel resistance of the U-shaped memory cells strings 132 and 133. As a result, the performance the 3D memory device 100 can be improved and the power consumption thereof can be decreased.

Although the 3D memory device 100 as depicted in FIG. 1F is a 3D memory device having at least one U-shaped memory cells string, but the method of applying the ion implantation process 130 to reduce the channel resistance of the memory cells strings of the 3D memory device 100 may not be limited to merely applying to this kind of the 3D memory device 100. For example, in some embodiments of the present disclosure, the method may be applied to the 3D memory device having a bottom source (not shown).

FIGS. 2A to 2G are cross-sectional views illustrating a series processing structures for forming a 3D memory device 200 in accordance with one embodiment of the present disclosure. The method for fabricating a 3D memory device 200 comprises several steps as follows: Firstly, a substrate 201 is provided, and a multi-layer stacking structure 110 is formed on the substrate 201 (see FIG. 2A). In some embodiments of the present disclosure, the substrate 201 may include a poly-silicon layer 201a, and the multi-layer stacking structure 110 is formed on and directly in contact to the poly-silicon layer 201a. Since the process and material for forming the multi-layer stacking structure 110 have been disclosed above, thus they will not be redundantly described here.

Figure 2A:
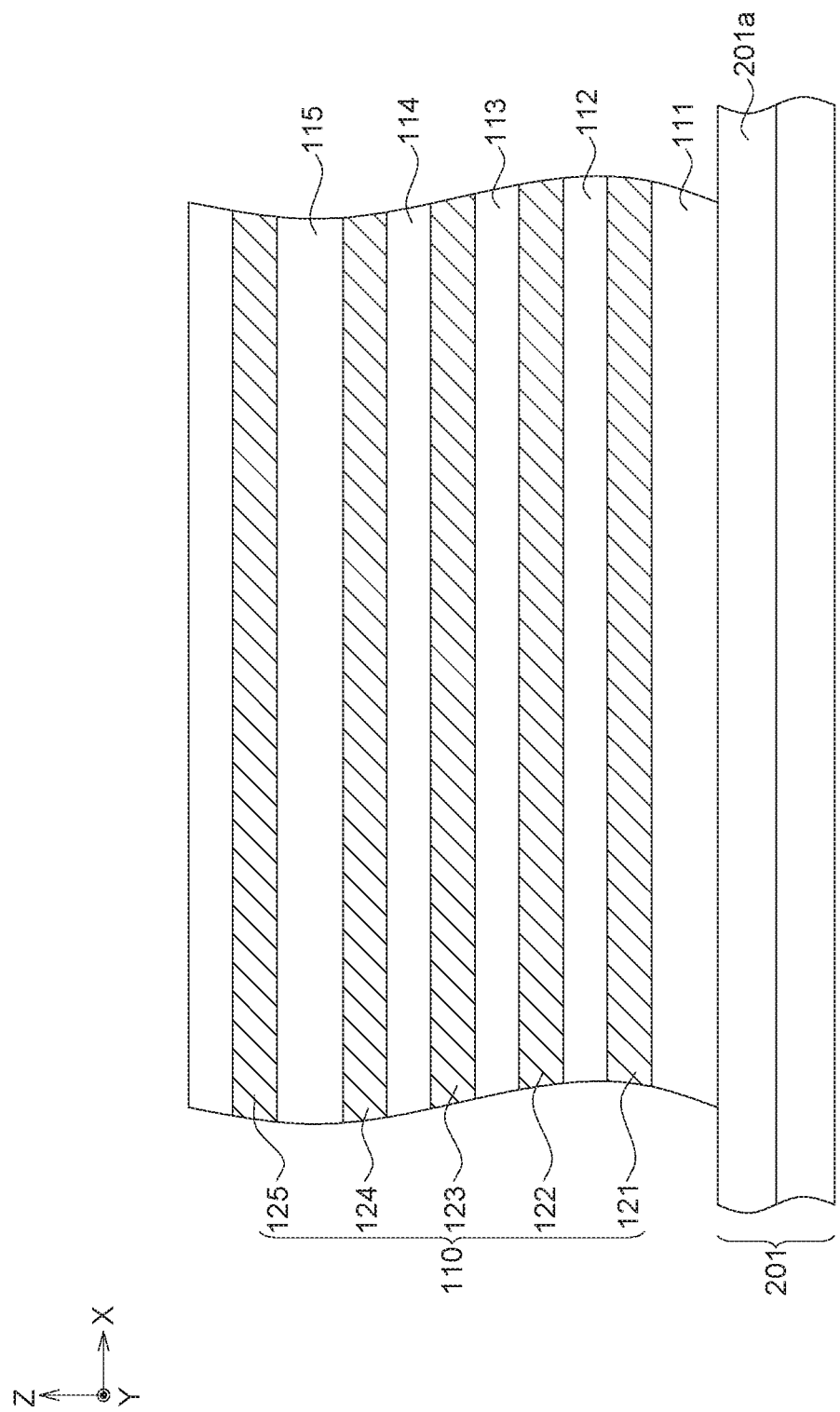
FIGS. 2A to 2G are cross-sectional views illustrating a series processing structures for forming a 3D memory device in accordance with another embodiment of the present disclosure.
Figure 2B:
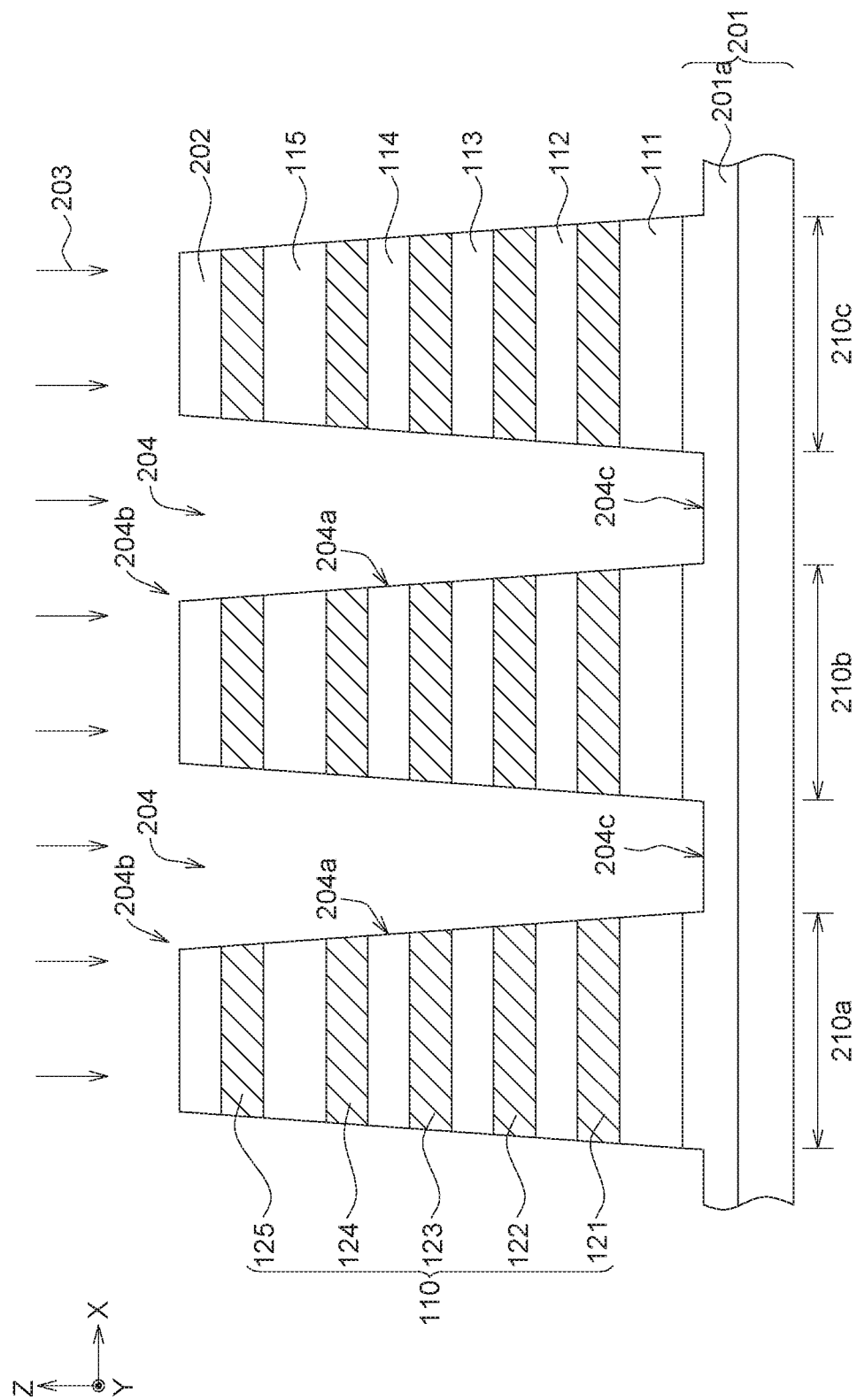
Figure 2C:
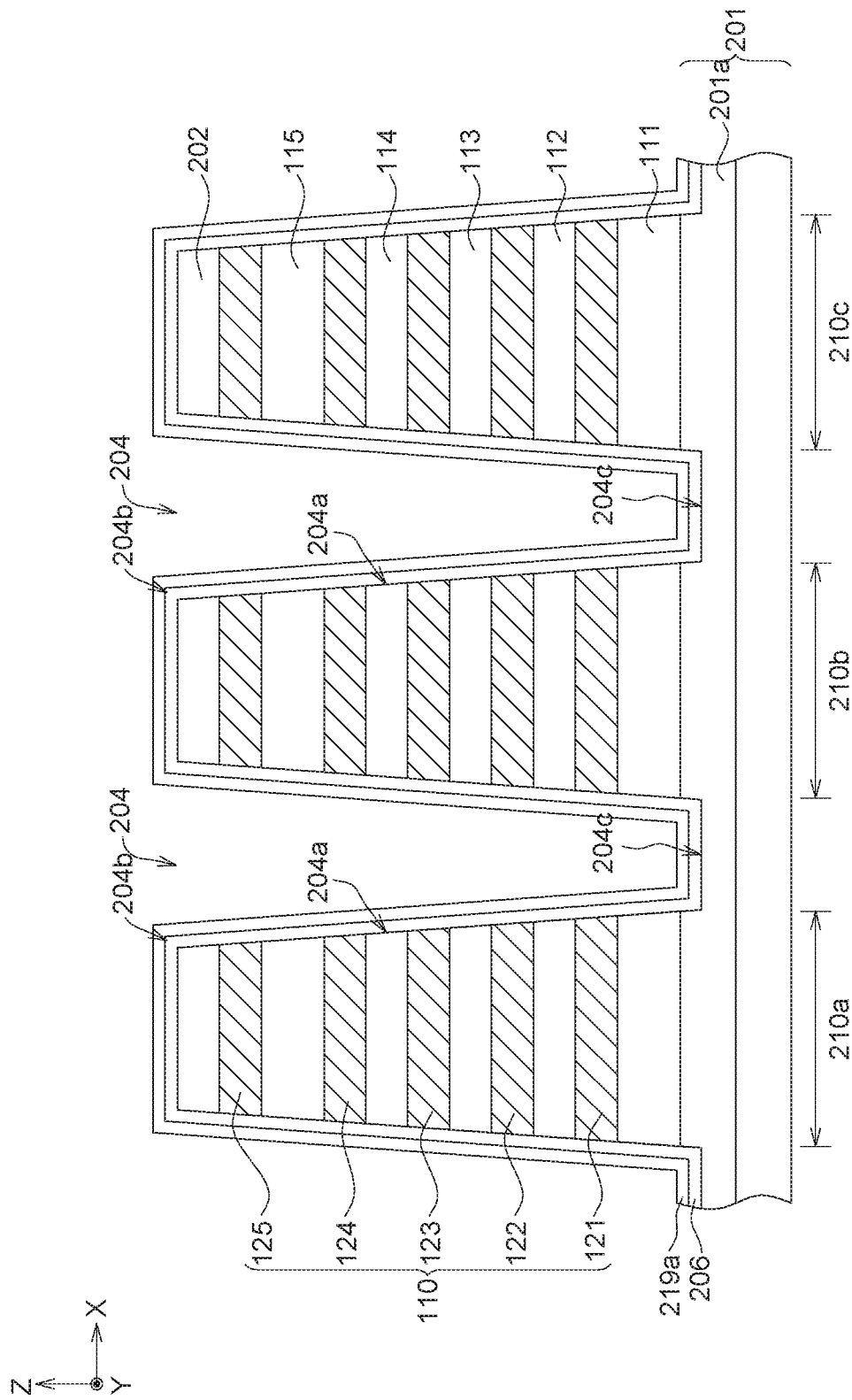

Next, the multi-layer stack 110 is patterned to form a plurality of ridge-shaped stacks 210a, 210b and 210c (see FIG. 2B). In some embodiments of the present disclosure, the process for patterning the multi-layer stacking structure 110 comprises steps as follows: A hard mask layer 202 is firstly provided on a top surface of the multi-layer stacking structure 110. Next, the hard mask layer 202 is patterned, and an anisotropic etching process, such as RIE process is performed using the patterned hard mask 102 as an etching mask to remove a portion of the multi-layer stacking structure 110, so as to form a plurality of trenches 204 extending along the Z-axis, wherein the multi-layer stacking structure 110 may be divided into the plurality of ridge-shaped stacks 210a, 210b and 210c extending along the Y-axis; and portions of the poly-silicon layer 201a can be exposed from the trenches 204.

Thereinafter, a memory layer 206 is formed to cover on the top surface of the ridge-shaped stacks 210a, 210b and 210c and to extend into the trenches 204, so as to cover on the sidewalls 204a of and the bottoms of the trenches 204 (that are the portions of the poly-silicon layer 201a exposed from the trenches 204). Subsequently, a channel layer 209 is formed to blanket over the memory layer 206 by a conformal deposition process (see FIG. 2C).

Figure 2D:
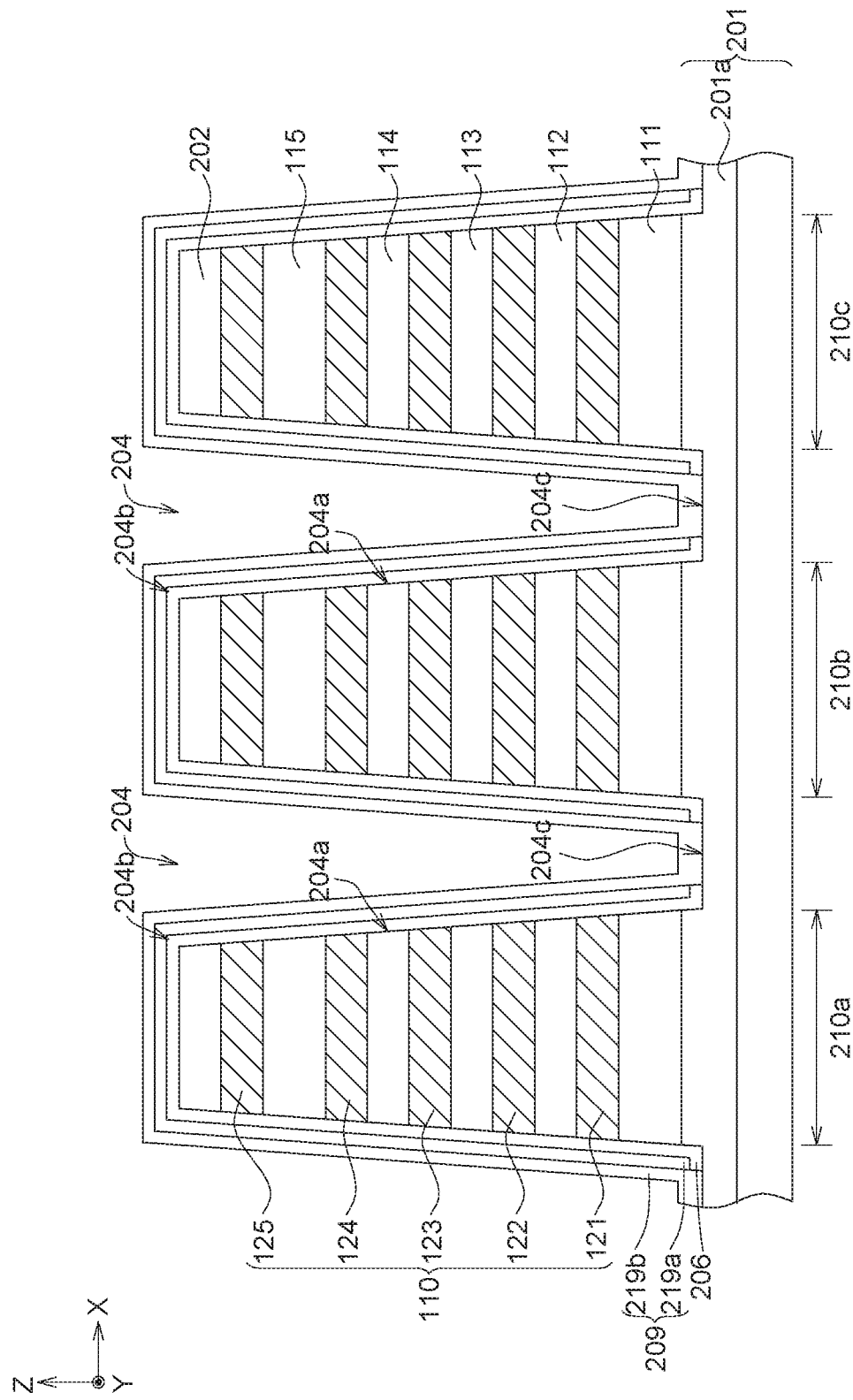
Figure 2E:
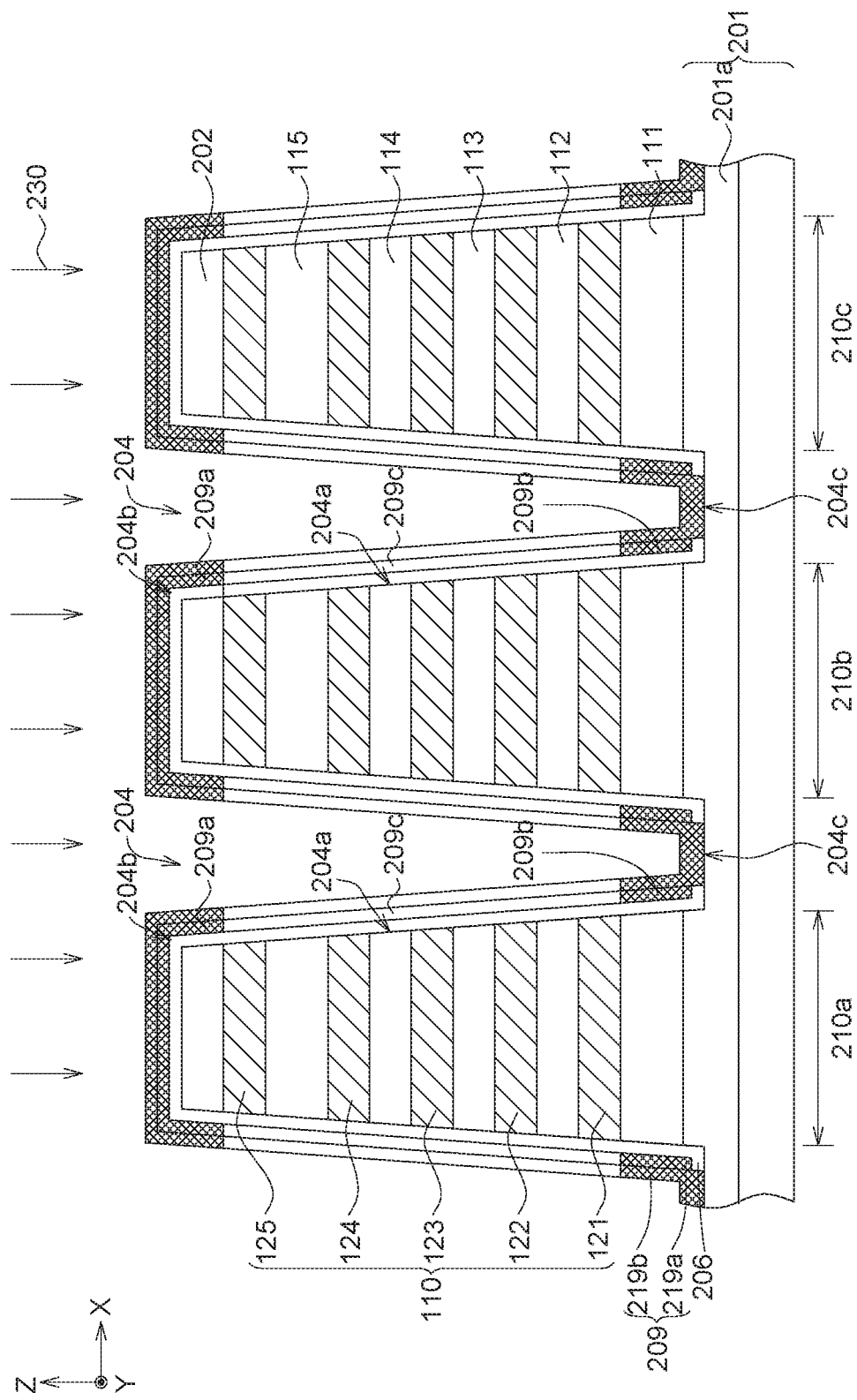

The channel layer 209 is then subjected to an ion implantation process 230 by which a plurality of dopants are driven into the channel layer 209, so as to at least divide the channel layer 209 into an upper portion 209a, a lower portion 209b and a string portion 209c (see FIG. 2D). Since each of the trenches 204 has a profile narrowed from top to bottom due to the natures of the etching process for forming the same, thus most of the dopants provided by the ion implantation process 230 may be likely driven into the upper portion 209a adjacent to an opening 204b of the trench 204 and the lower portion 209b adjacent to the bottom 204c of the trench 204, and the dopants may be seldom being driven into the string portion 209c that is disposed on the sidewall and used to connect the upper portion 209a and the lower portion 209b. As a result, the string portion 209c of the channel layer 209 may have a doping concentration substantially lower than that of the upper portion 209a and a lower portion 109b of the channel layer 209. In some embodiments of the present disclosure, the lower portion 209b of the channel layer 209 may extend upwards from the bottom 204c of the trenches 204 but not beyond the top surface 111a of the low most conductive layer 111 of the multi-layers structure 110.

Next, another etching process is performed to remove the portions of the channel layer 209 to isolate each of the portions of the channel layer respectively disposed on the f ridge-shaped stacks 210a, 210b and 210c. Thereafter, a dielectric layer 228 is formed to full-fill the trenches 204 and cover on the remaining portions of the channel layer 209 (see FIG. 1E).

Subsequently, a plurality of contact plugs 229A-229F are formed on each of the ridge-shaped stacks 210a, 210b and 210c penetrating through the dielectric layer 228 and electrically connecting to the top portions 209a of the channel layer 209 respectively disposed on the corresponding ridge-shaped stacks 210a, 210b and 210c. For example, in the present embodiment, two contact plugs 229A and 229B are formed on the ridge-shaped stack 210a; two contact plugs 229C and 229D are formed on the ridge-shaped stack 110b; and two contact plugs 229E and 299F are formed on the ridge-shaped stack 210c.

Yet another etching process (not shown) is performed to partially remove the dielectric layer 228 and the upper portion 209a of the channel layer 209 respectively disposed on the ridge-shaped stacks 210a, 210b and 210c, so as to divide the upper portion 209a of the channel layer 209 disposed on the ridge-shaped stacks 210a into a first pad 209a1 and a second pad 209a2 separated with each other to electrically isolate the contact plugs 229A and 229B, to divide the upper portion 209a of the channel layer 209 disposed on the ridge-shaped stacks 210b into a third pad 209a4 and a forth pad 209a4 separated with each other to electrically isolate the contact plugs 229D and 229E, and to divide the upper portion 209a of the channel layer 209 disposed on the ridge-shaped stacks 210c into a fifth pad 209a5 and a sixth pad 209a6 separated with each other to electrically isolate the contact plugs 229D and 229E.

The contact plugs 229A and 229B disposed on the ridge-shaped stack 210a are respectively electrically connected to the first pad 209a1 and the second pad 209a2. The contact plugs 2290 and 2290 disposed on the ridge-shaped stack 110b are respectively electrically connected to the third pad 209a3 and the forth pad 209a4. The contact plugs 229E and 229F disposed on the ridge-shaped stack 110c are respectively electrically connected to the fifth pad 209a5 and the sixth pad 209a6. Each of the first pad 209a1-sixth pad 209a6 can be connected in series with the memory cells formed on the cross points of the channel layer 209, the conductive layers 112-114 and the memory layer 206 to form a memory cell string 232 parallel to Z-axis. The memory cells 234 formed on the cross points of the channel layer 209, the conductive layer 115 and the memory layer 206 can be electrically connected in series with the memory cells 231 and serve as a SSL transistor of the corresponding memory cell string 232. The memory cells 235 formed on the cross points of the channel layer 209, the conductive layer 111 and the memory layer 206 can be electrically connected in series with the memory cells 231 and serve as a GSL transistor of the corresponding memory cell string 232. The poly-silicon layer 201a can serve as the common source line of the memory cell strings 232.

Figure 2F:
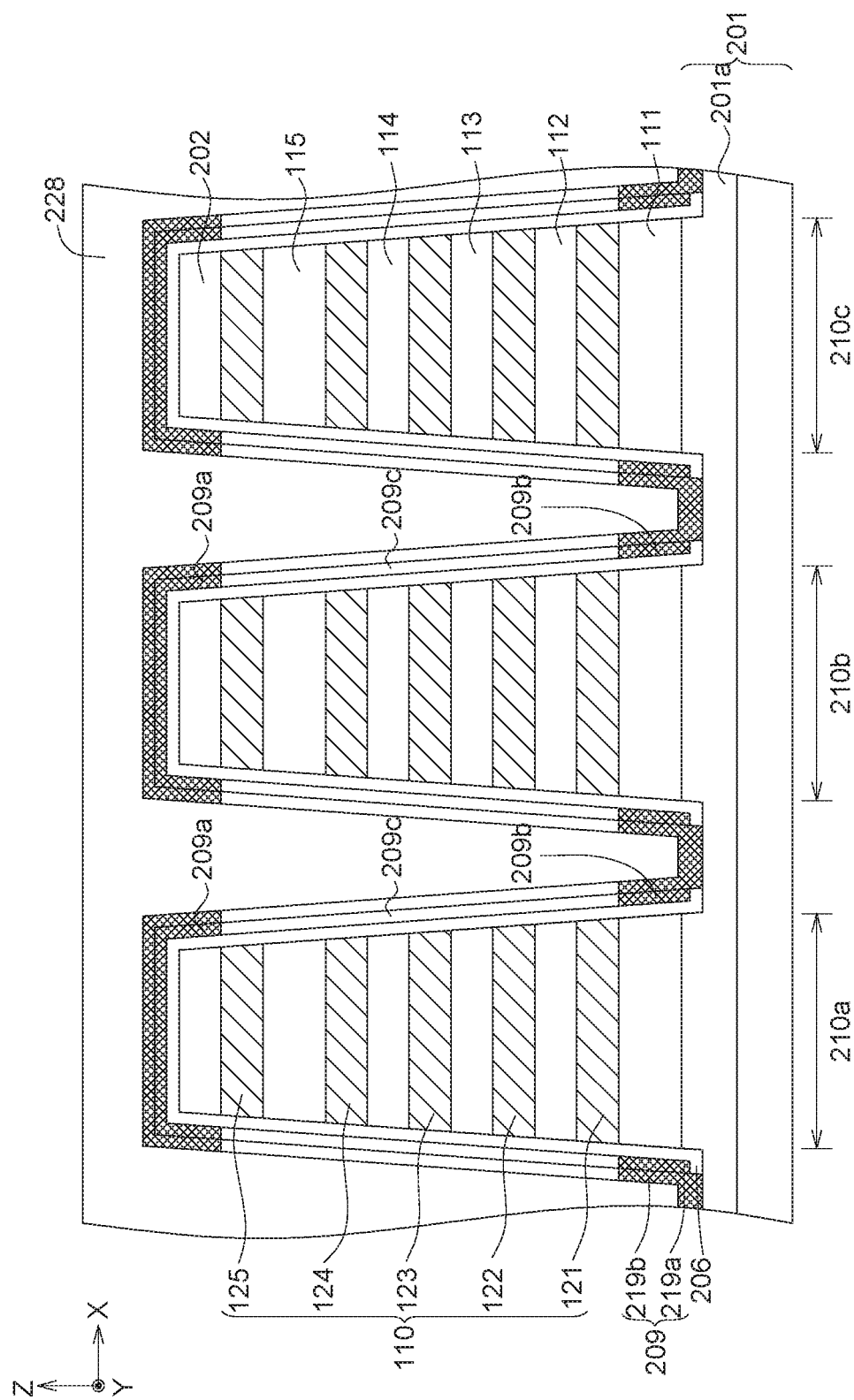
Figure 2G:
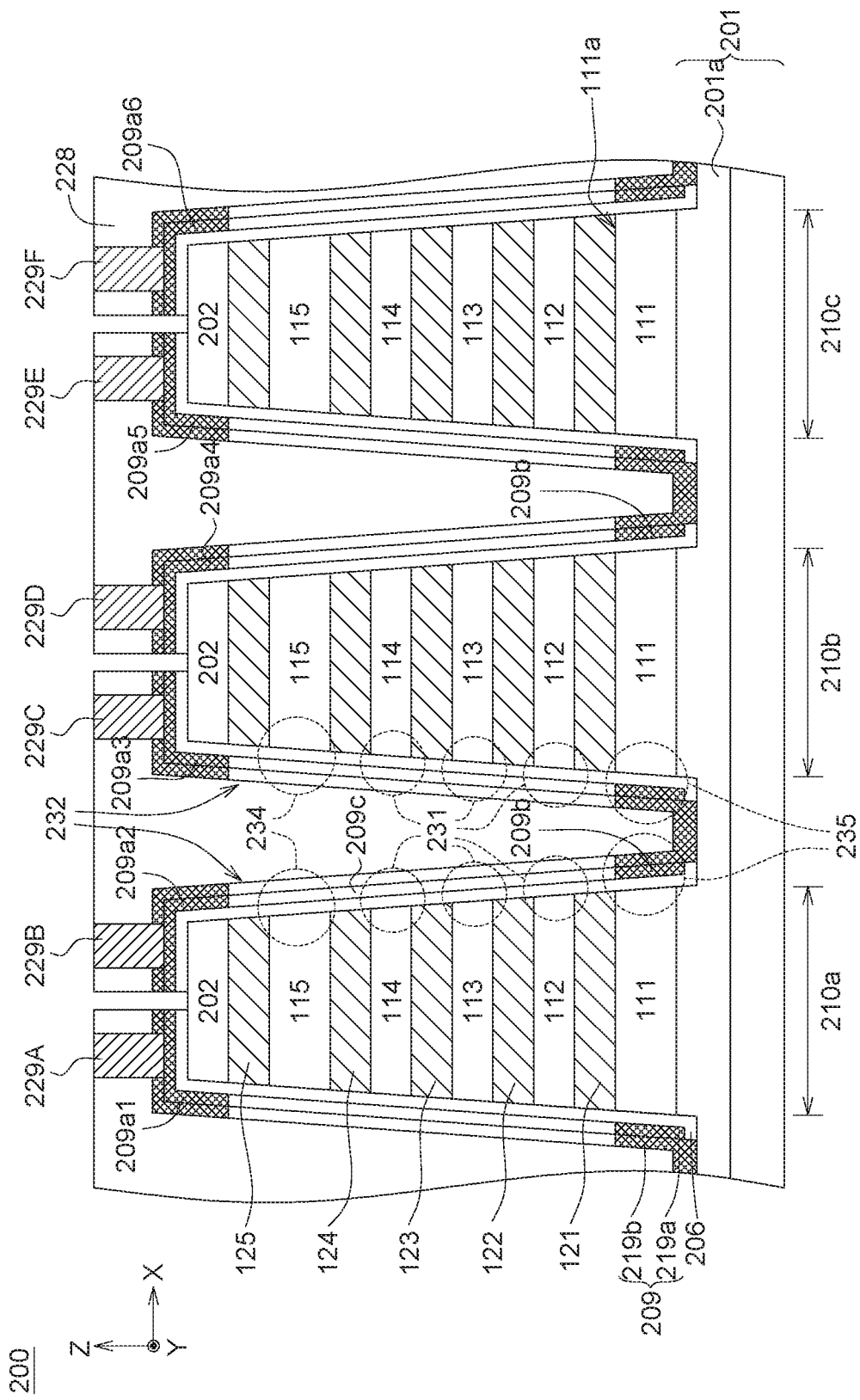

After a series of back end processes are carried out to form a plurality of metal contacts and/or other wires for connecting the contact plugs 229A-229F with the corresponding bit lines (not shown), the 3D memory device 200 as shown in FIG. 2F can be obtained.

By performing the ion implantation process 230 to drive a plurality of charged dopants into the lower portion 209b and the upper portion 209a of the channel layer 209 can reduce the channel resistance of the memory cells strings 232. As a result, the performance the 3D memory device 200 can be improved and the power consumption thereof can be decreased.

In accordance with the aforementioned embodiments of the present disclosure, a 3D memory device and the method for fabricating the same are provided. A patterned multi-layers stacking structure having a least one trench is firstly provided on a substrate. A memory layer and a channel are formed in sequence to cover on the patterned multi-layers stacking structure and at least extend into a sidewall of the trench. Prior to full-filling of the trench with a dielectric material, an ion implantation process is performed to drive a plurality of dopants into the channel layer, so as to make a string portion that is disposed on the sidewall of the trench has a doping concentration substantially lower than that of an upper portion of the channel adjacent to the opening of the trench and a lower portion of the channel adjacent to the bottom of the trench.

Because the upper portion and the lower portion of the channel layer can contain charged ion resulted from the ion implantation process, the resistance of the channel layer can be reduced significantly, and the problems of high channel resistance due to the increase in the levels of the multi-layers stacking structure and due to the natures of the etching process for forming the trenches in the multi-layers stacking structure to result in the dimension shrinkage of the trench bottom portion may be obviated.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) memory device, comprising:
   a substrate;
   a plurality of conductive layers, disposed on the substrate;
   a plurality of insulating layers, disposed on the substrate and alternately stacked with the conductive layers to form a multi-layers stacking structure, wherein the multi-layers stacking structure has at least one trench penetrating through the insulating layers and the conductive layers;
   a memory layer, covering on the multi-layers stacking structure and at least extends onto a first sidewall of the trench; and
   a channel layer, covering on the memory layer and includes:
   a first upper portion adjacent to an opening of the trench;
   a lower portion adjacent to a bottom of the trench;
   a first string portion disposed on the first sidewall, wherein the first string portion connects the first upper portion with the lower portion and has a doping concentration substantially lower than that of the first upper portion and lower portion, and the lower portion is disposed on the bottom of the trenches;
   a second upper portion, adjacent to the opening of the trench and isolated from the first upper portion; and
   a second string portion, disposed on a second sidewall of the trench, wherein one end of the second string portion is connected to the second upper portion; the other end of the second string portion is connected to the first string portion through the lower portion; and the second string portion has a doping concentration substantially lower than that of the second upper portion and lower portion.

2. The 3D memory device according to claim 1, wherein the substrate has a dielectric isolation layer in contact with the multi-layers stacking structure, and the bottom of the trench is disposed in the dielectric isolation layer.

3. The 3D memory device according to claim 1, wherein the substrate has a poly-silicon layer in contact with the multi-layers stacking structure, and the bottom of the trench is disposed in the poly-silicon layer.

4. The 3D memory device according to claim 1, wherein the lower portion extends upwards from the bottom of the trench but not beyond a top surface of a low most conductive layer of the plurality of conductive layers.

5. The 3D memory device according to claim 1, further comprising:
   a dielectric layer, full-filling the trench and covering on the channel layer; and
   a contact plug, penetrating through the dielectric layer and electrically connecting to the first top portion.

6. A method for fabricating a 3D memory device, comprising:
   forming a multi-layers stacking structure on a substrate, wherein the multi-layers stacking structure comprises a plurality of conductive layers and a plurality of insulating layers alternately stacked with the conductive layers;
   patterning the multi-layers stacking structure to form at least one trench in the multi-layers stacking structure and penetrating through the insulating layers and the conductive layers;
   forming a memory layer covering on the multi-layers stacking structure and at least extending onto a first sidewall of the trench; and
   forming a channel layer covering on the memory layer; and
   prior to full-filling of the trench with a dielectric material, performing an ion implantation process to drive a plurality of dopants into the channel layer, so as to at least divide the channel layer into:
   a first upper portion adjacent to an opening of the trench;
   a lower portion adjacent to a bottom of the trench;
   a first string portion disposed on the first sidewall, wherein the first string portion connects the first upper portion with the lower portion and has a doping concentration substantially lower than that of the first upper portion and lower portion, and the lower portion is disposed on the bottom of the trenches;
   a second upper portion, adjacent to the opening of the trench and isolated from the first upper portion; and
   a second string portion, disposed on a second sidewall of the trench, wherein one end of the second string portion is connected to the second upper portion; the other end of the second string portion is connected to the first string portion through the lower portion; and the second string portion has a doping concentration substantially lower than that of the second upper portion and lower portion.

7. The method according to claim 6, further comprising:
forming a dielectric layer for full-filling the trench and covering on the channel layer;
forming at least two contact plugs penetrating through the dielectric layer and electrically connecting to the top portion; and
performing an etching process to remove portions of the dielectric layer and the channel layer disposed on a top surface of the multi-layers stacking structure to electrically isolate the least two contact plugs.

8. The method according to claim 7, wherein the upper portion is divided into a first pad and a second pad by the etching process, and the first pad and the second pad are respectively in contact with the least two contact plugs.

9. The method according to claim 6, wherein the substrate has a dielectric isolation layer in contact with the multi-layers stacking structure, and the bottom of the trench is disposed in the dielectric isolation layer.

10. The method according to claim 6, wherein the substrate has a poly-silicon layer in contact with the multi-layers stacking structure, and the bottom of the trench is disposed in the poly-silicon layer.

11. The method according to claim 6, further comprising forming a protection layer on the channel layer, prior to the ion implantation process.

* * * * *